(12) United States Patent
Yokota et al.

(10) Patent No.: US 7,311,977 B2
(45) Date of Patent: Dec. 25, 2007

(54) HIGHLY-ORIENTED DIAMOND FILM, METHOD FOR MANUFACTURING THE SAME, AND ELECTRONIC DEVICE HAVING HIGHLY-ORIENTED DIAMOND FILM

(75) Inventors: Yoshihiro Yokota, Kobe (JP); Kazushi Hayashi, Kobe (JP); Takeshi Tachibana, Kobe (JP); Koji Kobashi, Kobe (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 15 days.

(21) Appl. No.: 11/281,607

(22) Filed: Nov. 18, 2005

(65) Prior Publication Data

US 2006/0112874 A1    Jun. 1, 2006

(30) Foreign Application Priority Data

Nov. 29, 2004 (JP) ............................ 2004-344860
Sep. 8, 2005 (JP) ............................ 2005-261335

(51) Int. Cl.
*B32B 9/04* (2006.01)
*B32B 13/04* (2006.01)
(52) U.S. Cl. ...................... 428/446; 428/408; 428/688
(58) Field of Classification Search .............. 428/408, 428/446, 688
See application file for complete search history.

(56) References Cited

U.S. PATENT DOCUMENTS 5,523,160 A * 6/1996 Kobashi et al. .............. 428/408
5,529,846 A * 6/1996 Hayashi et al. .............. 428/408

OTHER PUBLICATIONS

Yutaka Ando et al., "Growth of Diamond Films by a 5-kW Microwave Plasma CVD Reactor", Diamond and Related Materials Elsevier, Switzerland, vol. 10, No. 3-7, (Mar. 2001), pp. 312-315.

Hideaki Maeda et al., "Determination of Diamond [100] and [111] Growth Rate and Formation of Highly Oriented Diamond Film by Microwave Plasma-Assisted Chemical Vapor Deposition", Journal of Materials Research, New York, NY, vol. 10, No. 12, (Dec. 1995), pp. 3115-3123.

C. Wild et al., "Chemical Vapour Deposition and Characterization of Smooth {100}-Faceted Diamond Films", Diamond and Related Materials, Elsevier Science Publishers, Amsterdam, NL, vol. 2, No. 2/4, (Mar. 31, 1993), pp. 158-168.

V.G. Ralchenko et al., "Large-Area Diamond Deposition by Microwave Plasma", Diamond and Related Materials, Elsevier Science Publishers, Amsterdam, NL, vol. 6, No. 2-4, (Mar. 1997), pp. 417-421.

European Search Report dated Apr. 24, 2006.

Hiroshi Kawarada, "Heteroepitaxy and Highly Oriented Diamond Deposition", School of Science and Engineering, Waseda University, Tokyo, Springer Series in Materials Processing, 1998, pp. 140-162.

* cited by examiner

*Primary Examiner*—Felisa Hiteshew
(74) *Attorney, Agent, or Firm*—Reed Smith LLP; Stanley P. Fisher, Esq.; Juan Carlos A. Marquez, Esq.

(57) ABSTRACT

A highly-oriented diamond film which has a flat surface but does not have non-oriented crystals in the surface can be provided by depositing a first diamond layer on a substrate by {111} sector growth of diamond crystals by a CVD method using a gaseous mixture of methane and hydrogen as material gas, and then depositing a second diamond layer on the first diamond layer by {100} sector growth of diamond crystals by a plasma CVD method using a gaseous mixture of methane, hydrogen, and oxygen as material gas under the conditions that the pressure of the material gas is 133 hPa or more; the material gas composition is determined such that $([C]-[O])/[CH_3+H_2+O_2]$ is $-0.2 \times 10^{-2}$ or more and $[O]/[C]$ is 1.2 or less; and the substrate temperature is between 750° C. and 1000° C.

3 Claims, 8 Drawing Sheets

HIGHLY-ORIENTED DIAMOND FILM, METHOD FOR MANUFACTURING THE SAME, AND ELECTRONIC DEVICE HAVING HIGHLY-ORIENTED DIAMOND FILM

BACKGROUND OF THE INVENTION

1. Field of the Invention

The present invention relates to highly-oriented diamond films of which crystal grains are highly oriented, methods for manufacturing the same, and electronic devices having highly-oriented diamond films. Specifically, the present invention relates to highly-oriented diamond films suitable for electronic devices such as transistors and diodes, methods for manufacturing the same, and electronic devices having the highly-oriented diamond films.

2. Description of the Related Art

A highly-oriented diamond film is a polycrystalline film in a broad sense, but a growth direction and an in-plane direction of the crystal grains are each oriented in one direction and the surface is in a characteristic state of a series of flat (001) facets. Therefore, the highly-oriented diamond film is known that the crystal defect density near the surface is lower than that of general polycrystalline films and that the carrier mobility near the surface is about two figures higher than that of general polycrystalline films. Because of this, it is thought that the highly-oriented diamond film is suitable for electronic devices such as a field-effect transistor utilizing the carrier mobility in the lateral direction.

Such a highly-oriented diamond film can be formed by, for example, subjecting a silicon substrate to microwave radiation while applying a negative bias voltage in a gas phase containing methane gas (U.S. Pat. No. 5,523,160). Furthermore, a method for preparing a heteroepitaxial diamond film having a flat surface is suggested in B. Dischler, C. Wild, eds. Low-Pressure Synthetic Diamond, 1998:153-158 (referred to as non-patent document, hereinafter). In the method, after the application of a bias voltage to a substrate, predominant [001] growth of diamond (a first growth) is performed at a rate of 3.9 to 4.5 µm/hr for improving a degree of orientation of crystalgrains, and then surface-planarizing growth (a second growth) of diamond is performed at a rate of 2 µm/hr or less for planarizing the surface.

The above-mentioned conventional technologies have some problems as follows: In an electronic device such as a transistor having a diamond film, properties of the device are improved with an increase in the diamond crystal grain size. For example, in the application to a transistor, since a gate length is generally 30 to 100 µm, the highly-oriented diamond film must have a crystal grain size of at least 30 µm, preferably 100 µm or more. When the highly-oriented diamond film is prepared according to the method disclosed in the non-patent document, diamond crystals grow in a columnar form in the first growth to gradually increase the grain sizes. However, since the increasing rate is small, a film having a large thickness is required for ensuring a crystal grain size of 30 µm or more; which is a problem.

Furthermore, a diamond film having a flat surface is desirable. However, in the method described in the non-patent document, the diamond in the second growth is synthesized under such conditions that a growth rate in [111] orientation is higher than that in [001] orientation. Therefore, even if protruding non-oriented crystals are slight, the non-oriented crystals predominantly grow. When a highly-oriented diamond film containing non-oriented crystals is applied to an electronic device as a substrate, the surface is planarized by polishing after a film is epitaxially deposited on the diamond film for preventing inner damage caused by the polishing and for doping. This causes changes in growth sectors at the non-oriented crystal portions. Since distribution coefficients of an impurity differ in the growth sectors, the non-oriented crystal portions and the other portions each have an impurity content being different from that of each other when the epitaxially grown film is doped with the impurity. This is undesirable for device movement. Therefore, when the method disclosed in the non-patent document is conducted, the first growth must be performed until the non-oriented crystals do not protrude. Consequently, a thin film, for example, having a thickness of 50 µm or less cannot be formed by this method; which is a problem.

The non-patent document discloses that a smooth diamond film having a film thickness is 5 µm or less can be formed by using a favorable SiC film as a buffer layer. However, in this case, a ratio of the average crystal grain size to the film thickness (average crystal grain size/film thickness) is still ½ or lower, so a large film thickness is required for yielding an average crystal grain size of 30 µm or more. This problem has not been solved yet.

SUMMARY OF THE INVENTION

The present invention has been accomplished in view of such problems. Accordingly, it is an object of the present invention to provide a highly-oriented diamond film of which surface is flat and does not contain non-oriented crystals and of which crystal grain size is large though the film thickness being smaller than that of conventional films. Another object of the present invention is to provide a method for manufacturing the highly-oriented diamond film and an electronic device having the highly-oriented diamond film.

A highly-oriented diamond film according to a first aspect of the present invention includes a first diamond layer deposited by {111} sector growth and a second diamond layer deposited on the first diamond layer by {100} sector growth so that the crystal grain sizes increase with distance from the first diamond layer, wherein an average crystal grain size of the second diamond layer at the surface is represented by Da (µm); an average crystal grain size of the first diamond layer at the boundary of the first diamond layer and the second diamond layer or an average crystal grain size of the first diamond layer at a cross-section being the closest to the boundary and parallel to the surface of the second diamond layer when the boundary is not parallel to the surface of the second diamond layer is represented by Db (µm); and a distance from the surface of the second diamond layer to the boundary or the cross-section is represented by L (µm), wherein a grain-size-increasing rate M (%) that is calculated by the following mathematical formula:

$$M = \{(Da - Db)/L\} \times 100 \qquad (1)$$

is 50% or higher.

In the present invention, since the crystal grain size sharply increases such that the grain-size-increasing rate M is 50% or more, a highly-oriented diamond film having large grain sizes though the film thickness being smaller than that of conventional films can be yielded. Additionally, since the highly-oriented diamond film has the second diamond layer deposited by the {100} sector growth on the first diamond layer deposited by the {111} sector growth, the surface is flat and hardly contains non-oriented crystals. With this, a process, such as polishing, for planarizing the surface is unnecessary. Furthermore, the highly-oriented diamond film used in an electronic device does not prevent the conduction of electric charge. Additionally, even if diamond is epitaxially deposited on the surface of the highly-oriented diamond film, variation in impurity content does not occur; thus, an epitaxial film of diamond having a flat surface can be yielded.

The superficial layer at the second diamond layer side of the first diamond layer can be formed such that differences $\{\Delta\alpha, \Delta\beta, \Delta\gamma\}$ between Euler angles $\{\alpha, \beta, \gamma\}$ of adjacent crystal grains are $|\Delta\alpha|\leq 1°$, $|\Delta\beta|\leq 1°$, and $|\Delta\gamma|\leq 1°$. With this, the second diamond layer can be deposited on the first diamond layer so that the surface is flat and hardly contains non-oriented crystals. Here, Euler angles $\{\alpha, \beta, \gamma\}$ are values showing crystal orientation of a crystal grain.

The average crystal grain size at the surface of the second diamond layer is preferably 30 μm or more, more preferably 100 μm or more. With this, characteristics of a transistor to which the highly-oriented diamond film is applied can be improved.

The surface of the second diamond layer can be made of (100) planes. With this, the surface can be planarized.

A method for manufacturing a highly-oriented diamond film according to a second aspect of the present invention includes:

a step of depositing a first diamond layer on a substrate by $\{111\}$ sector growth of diamond crystals by a chemical vapor deposition method; and a step of depositing a second diamond layer on the first diamond layer by $\{100\}$ sector growth of diamond crystals by a chemical vapor deposition method using a material gaseous mixture containing carbon-containing gas and oxygen gas, wherein the gas pressure of the material gas is 133 hPa or more;

the material gas composition is determined such that a value calculated by dividing a difference between an amount (mole) of carbon atoms and an amount (mole) of oxygen atoms by an amount (mole) of total gas molecules is $-0.2\times 10^{-2}$ or more and a ratio (O/C) of the amount (mole) of oxygen atoms to the amount (mole) of carbon atoms is 1.2 or less; and a substrate temperature is higher than 750° C. and is lower than 1000° C.

In the present invention, defects in the second diamond layer can be decreased and the average grain-size-increasing rate can be increased to 50% or more by optimizing conditions of gas-phase composition when the second diamond layer is deposited.

In the method for manufacturing the highly-oriented diamond film, the substrate temperature in the step of depositing the second diamond layer may be between 750° C. and 900° C. when the material gas composition is such that a value calculated by dividing the difference between the amount (mole) of carbon atoms and the amount (mole) of oxygen atoms by the amount (mole) of total gas molecules is $1.0\times 10^{-2}$ or more or such that a ratio (O/C) of the amount (mole) of oxygen atoms to the amount (mole) of carbon atoms is 0.5 or less. With this, occurrence of defects in the second diamond layer can be suppressed.

The second diamond layer can be deposited, for example, by a plasma vapor deposition method or a hot-filament vapor deposition method. With this, non-oriented crystals in the surface of the second diamond layer can be decreased.

In the step of depositing the first diamond layer, oriented diamond nuclei may be formed on a surface of the substrate.

Then, the first diamond layer may be deposited on the substrate by $\{111\}$ sector growth of diamond crystals by a chemical vapor deposition method using a material gaseous mixture not containing oxygen gas.

In the step of depositing the second diamond layer, the second diamond layer may be deposited by $\{100\}$ sector growth of diamond crystals while gradually or stepwise raising the ratio of oxygen gas. With this, the second diamond layer can be efficiently deposited with proper balance of an increase in the grain size and a growth rate.

A diamond electronic device according to a third aspect of the present invention includes the above-mentioned highly-oriented diamond film.

According to the present invention, since the diamond electronic device has the above-mentioned highly-oriented diamond film, the characteristics can be improved and the cost can be decreased in comparison with the conventional diamond electronic devices.

The electronic device may be, for example, a transistor.

According to the present invention, the crystal grain sizes are sharply increased so that the grain-size-increasing rate M is 50% or more. Therefore, the crystal grain sizes can be increased though the film thickness being smaller than that of conventional films. The second diamond layer is deposited by the $\{100\}$ sector growth on the first diamond layer deposited by the $\{111\}$ sector growth. Therefore, the highly-oriented diamond film of which surface is flat and does not contain non-oriented crystals can be yielded.

DESCRIPTION OF THE PREFERRED EMBODIMENTS

Figure 1:
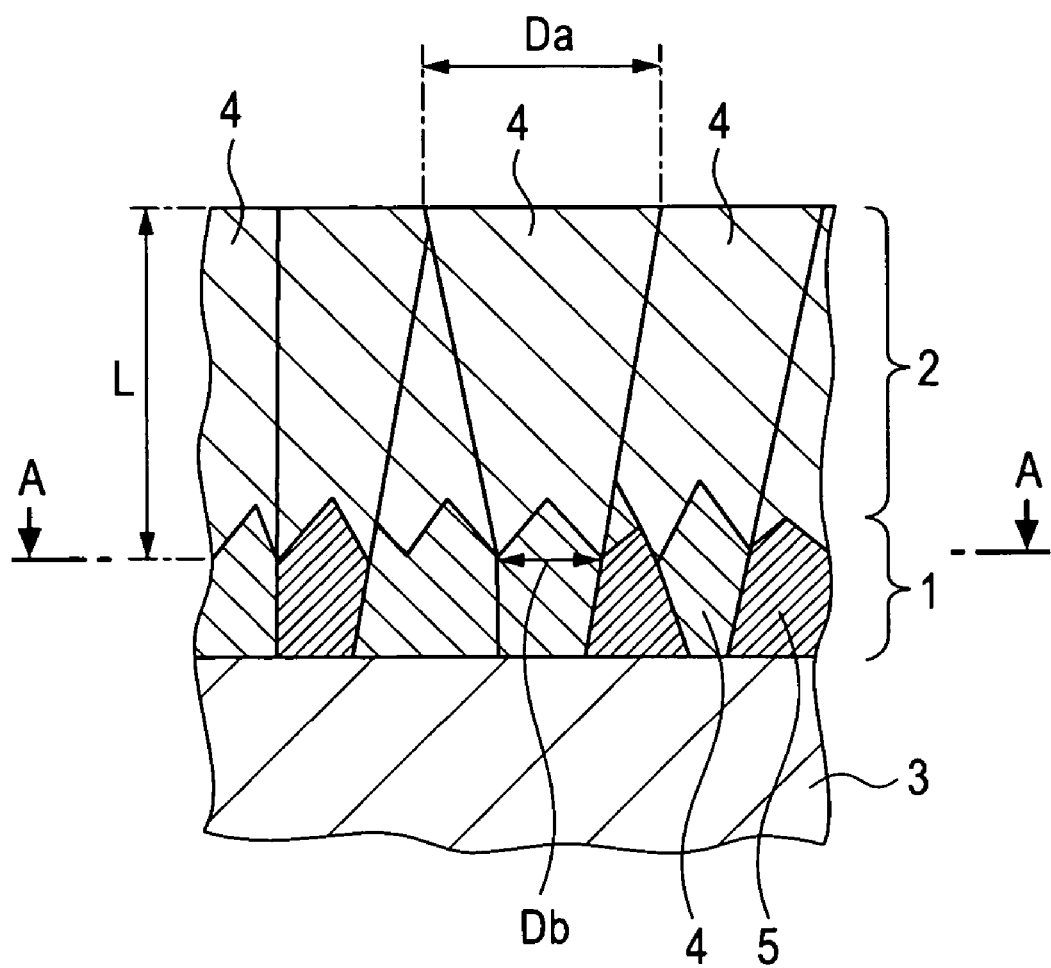
FIG. 1 is a schematic cross-sectional view of a highly-oriented diamond film according to an embodiment of the present invention.

Highly-oriented diamond films according to the embodiments of the present invention will now be specifically described with reference to the attached drawings. FIG. 1 is a schematic diagram showing a highly-oriented diamond film according to an embodiment. In FIG. 1, non-oriented crystals are shown by fine hatching for easy view. As shown in FIG. 1, the highly-oriented diamond film according to this embodiment includes a first diamond layer 1 having substantially constant crystal grain sizes and a second diamond layer 2 on the first diamond layer 1. The second diamond layer 2 includes a portion of which crystal grain sizes increase with distance from the first diamond layer 1. Diamond crystals which appear in the surface of the second diamond layer are formed by continuous growth of the crystals from the boundary between the first diamond layer and the second diamond layer at a grain-size-increasing rate of 50% or more.

The diamond layer 1 is mainly deposited by {111} sector growth of diamond crystals on a substrate 3 made of silicon, nickel, platinum, iridium, palladium, sapphire, gallium nitride, silicon carbide, strontium titanate, or the like. In this case, when differences $\{(\alpha_1-\alpha_2), (\beta_1-\beta_2), (\gamma_1-\gamma_2)\}$ between Euler angles $\{\alpha_1, \beta_1, \gamma_1\}$ and $\{\alpha_2, \beta_2, \gamma_2\}$ of the respective adjacent crystal grains are defined as $\{\Delta\alpha, \Delta\beta, \Delta\gamma\}$, a superficial layer at the diamond layer 2 side of the diamond layer 1 preferably has the differences such that $|\Delta\alpha|\leq 1°$, $|\Delta\beta|\leq 1°$, and $|\Delta\gamma|\leq 1°$. With this, the diamond layer 2 which has a flat surface hardly containing non-oriented crystals can be deposited on the diamond layer 1. The superficial layer contains the diamond layer 1 in the range of at least 50 μm from the surface at the diamond layer 2 side of the diamond layer 1 in the thickness direction.

The diamond layer 2 is mainly deposited by {100} sector growth of diamond crystals. The surface, namely, the surface of the highly-oriented diamond film according to this embodiment is a flat plane constituted by (100) planes. The surface of the second diamond layer 2 preferably has an average roughness Ra of 100 nm or less at the portions other than the grain boundaries. The average roughness Ra in this embodiment is based on JIS B0601: Arithmetic Average Roughness Ra. The diamond layer 2 is mainly constituted by oriented crystals 4, and the surface hardly contains non-oriented crystals 5. The average crystal grain size at the surface of the diamond layer 2 is 30 μm or more. The grain size can be increased to about 10 mm, but a grain size of 100 μm to 1 mm is preferable.

In the highly-oriented diamond film according to this embodiment, the average crystal grain size of the second diamond layer 2 at the surface is represented by Da (μm). When the boundary (shown by the A-A line in FIG. 1) of the first diamond layer 1 and the second diamond layer 2 is parallel to the surface of the second diamond layer 2, the average crystal grain size of the first diamond layer 1 at the boundary is represented by Db (μm). When the boundary is not parallel to the surface of the second diamond layer 2, the average grain size of the first diamond layer 1 at the cross-section which is parallel to the surface of the second diamond layer 2 and is the closest to the boundary in the first diamond layer 1 is represented by Db (μm). Furthermore, a distance between the surface of the diamond layer 2 and the boundary or the cross-section (A-A line) is represented by L (μm). In the present invention, the grain-size-increasing rate M (%) calculated by the following mathematical formula 2 using the Da, Db, and L is 50% or higher. A larger grain-size-increasing rate M is preferable. In the highly-oriented diamond film according to this embodiment, a grain-size-increasing rate M of about 500% can be achieved by adjusting manufacturing conditions. The grain-size-increasing rate M is preferably 60% to 500%, more preferably 60% to 200%, from the viewpoint of the balance with a film deposition rate.

$$M=\{(Da-Db)/L\}\times 100 \tag{2}$$

Figure 2A:
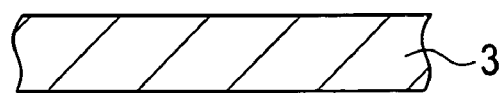
FIGS. 2A to 2E are schematic diagrams showing a method for manufacturing a highly-oriented diamond film in order of processing according to an embodiment of the present invention.
Figure 2B:
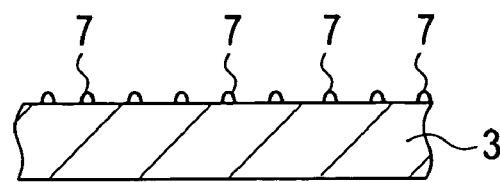
Figure 2C:
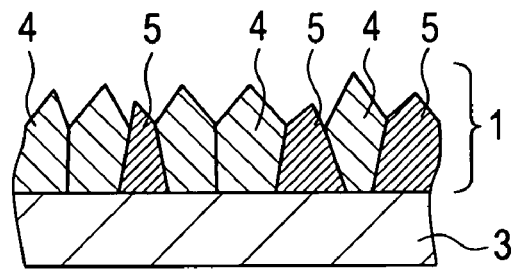
Figure 2D:
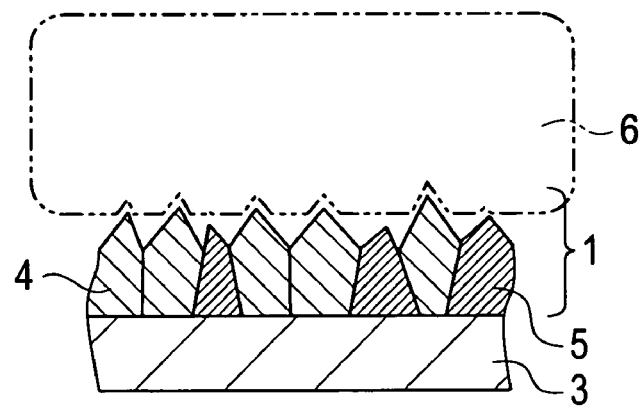
Figure 2E:
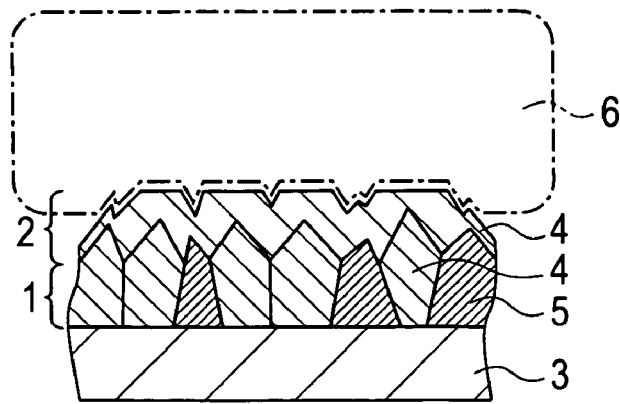

A method for manufacturing the highly-oriented diamond film according to this embodiment will now be described. FIGS. 2A to 2E are schematic diagrams showing a method for manufacturing the highly-oriented diamond film in order of processing according to this embodiment. In FIGS. 2C to 2E, non-oriented crystals are shown by fine hatching for easy view. Firstly, with reference to FIG. 2A, a substrate 3 made of silicon, nickel, platinum, iridium, palladium, sapphire, gallium nitride, silicon carbide, strontium titanate, or the like is prepared. Then, with reference to FIG. 2B, a bias voltage is applied to the substrate 3 under exposure to methane and hydrogen gas plasma in order to form oriented diamond nuclei 7 on a surface of the substrate 3.

With reference to FIG. 2C, the {111} sector growth of diamond on the substrate 3 is performed by a chemical vapor deposition (CVD) method using a gaseous mixture of methane and hydrogen as material gas. This suppresses the growth of non-oriented crystals and generates differences in height of non-oriented crystals 5 and oriented crystals 4; thus, a diamond layer 1 having a superficial layer in which differences $\{\Delta\alpha, \Delta\beta, \Delta\gamma\}$ between Euler angles of adjacent crystal grains are $|\Delta\alpha|\leq 1°$, $|\Delta\beta|\leq 1°$, and $|\Delta\gamma|\leq 1°$ is deposited. With the diamond layer 1 having such a constitution, crystal grain sizes in a diamond layer 2 to be deposited on the diamond layer 1 can be effectively increased.

The thickness of the diamond layer 1 does not have any limitation as far as a sufficient degree of the orientation of the diamond crystals is achieved. However, the thinner diamond layer 1 is preferable for yielding the highly-oriented diamond film having a smaller thickness though an average crystal grain size being large. The surface state of the diamond layer 1 does not also have any limitation. For example, the surface may be a flat face of predominant (100) planes parallel to the surface of the substrate 3 or may be a pyramidal state having a peak in the <100> direction.

As shown in FIGS. 2D and 2E, the diamond layer 2 is deposited on the diamond layer 1 by the {100} sector growth of diamond by the CVD method using a gaseous mixture of methane, hydrogen, and oxygen as material gas. In the CVD method, when the surface has microscopic asperities, the growth rate at the salients is different from that at the reentrants. The most preferable example of the CVD method is a plasma CVD method in which electric field tends to converge to the salients, so the growth rate of diamond at the salients is higher than that at reentrants. A hot-filament CVD method, in which electric field tends to converge to the salients by applying a bias voltage, so the growth rate of diamond at the salients is higher than that at the reentrants, can be also used.

Figure 3A:
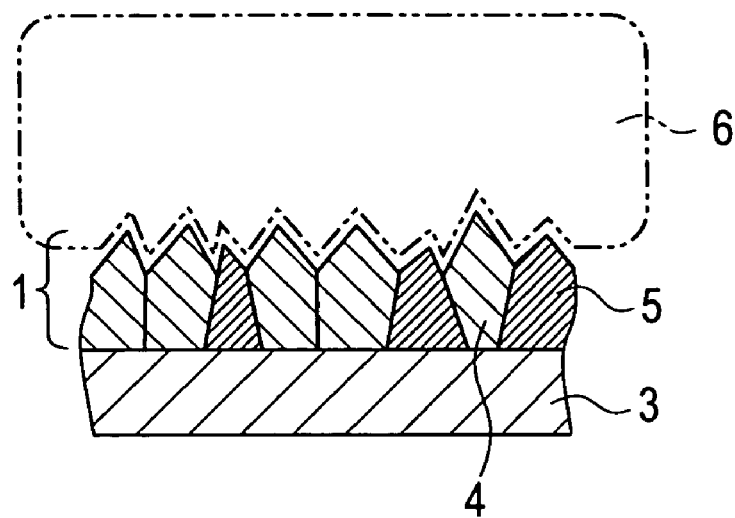
FIGS. 3A and 3B are schematic diagrams showing film states of a diamond layer 2 in order of processing when the gas pressure is less than 130 hPa (which is outside of the scope of the present invention).
Figure 3B:
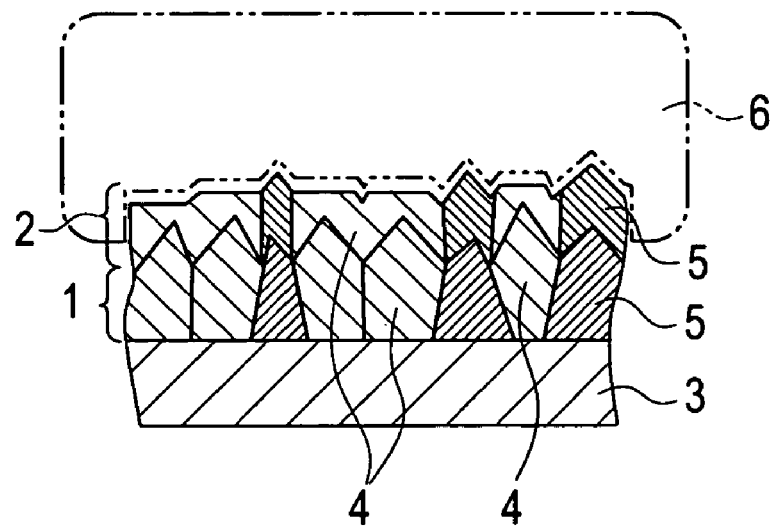

At this stage, the pressure of the material gas is maintained at 133 hPa or higher. The crystal grain size of the diamond layer 2 to be deposited increases with the gas pressure when the diamond layer 2 is deposited. The pressure of the material gas may be at around atmospheric pressure of 1013 hPa, but a material gas pressure of 267 hPa or less is preferable. FIGS. 3A and 3B are schematic diagrams showing film deposition states of the diamond layer 2 in order of processing when the gas pressure is lower than 133 hPa (which is outside of the scope of the present invention). When the gas pressure is lower than 133 hPa, free paths of active molecules and active atoms (these are collectively referred to as active species, hereinafter) in the material gas are long. Consequently, the active species reach the surface without substantial influence from microscopic asperities in the surface. As shown in FIG. 3A, plasma 6 equally covers the surface of the diamond layer 1 so as to trace the asperities formed in the surface of the diamond layer 1. Therefore, the difference in temperature is decreased and the growth rates become equal. As a result, as shown in FIG. 3B, not only oriented crystals 4 but also non-oriented crystals 5 grow, so many non-oriented crystals 5 also appear in the surface of the diamond film and the flatness of the surface is decreased. Furthermore, the crystal size-increasing rate is also decreased.

On the other hand, when the gas pressure is equal to or higher than 133 hPa as in this embodiment, the free paths of the active species are short. Generally, electrode distribution between plasma and a diamond film has a property to focus on salients. In a method for manufacturing the highly-oriented diamond film according to this embodiment, since the free paths of active species are short, as shown in FIG. 2D, the active species hardly reach the reentrants. Therefore, the growth rate at the reentrants is decreased because the plasma 6 becomes weak to decrease the temperature. On the other hand, the growth rate at the salients is increased because a large amount of active species reach the salients to increase the temperature. As a result, crystals do not grow at the reentrants, i.e., on the non-oriented crystals 5, but crystals grow larger at the salients, i.e., on the oriented crystals 4. However, with this alone, the difference in height of the crystals is enhanced and the planarization of the surface cannot be achieved. Then, the increase of difference in the height of the crystals at the surface can be suppressed by adjusting the oxygen content in the material gas. When a salient height becomes large, the temperature at the salient increases too high, for example, it exceeds 1000° C. By using the material gas not containing oxygen atoms, non-diamond carbon, microcrystalline diamond, and twin-crystalline diamond start to grow at this salient. On the other hand, oxygen has an effect to etch defects generated in the diamond layer, and the effect is increased with the temperature. Therefore, as shown in FIG. 2E, when the material gas contains oxygen atoms at an adequate content as in this embodiment, the occurrence of the non-diamond carbon, the microcrystalline diamond, and the twin-crystalline diamond in the diamond layer can be suppressed. Consequently, the asperities in the surface of the diamond layer do not grow larger than a certain difference in the height; thus, the surface is planarized.

The shape of the diamond layer 1 of the lower layer at this stage is important. Since the diamond layer 1 is synthesized under conditions such that the growth rate in the <100> direction is the highest, each crystal has a pyramidal state having a peak in the <100> direction. However, the <100> direction of each crystal has a tilt against the substrate at within ±5°. It is believed that this is caused by difference in lattice constants of silicon and diamond. Since the growth rate at the <100> direction is thought to be constant, a crystal having the highest peak against the surface of the substrate does not have a tilt. When the diamond layer 2 is deposited, a crystal having a higher peak grows faster. Therefore, crystals not having a tilt preferentially grow and increase the gain size. Then, only the crystals not having a tilt further grow to become into contact with each other at grain boundaries. This readily causes coalescence of a plurality of crystals, so the grain size is acceleratingly increased.

Furthermore, the material gas composition and the substrate temperature during the deposition of the diamond layer 2 also have influence on the properties of the film. Therefore, in the method for manufacturing the highly-oriented diamond film according to this embodiment, the material gas composition is preferably determined such that a value calculated by dividing a difference between an amount (mole) of carbon atoms [C] and an amount (mole) of oxygen atoms [O] by an amount (mole) of total gas molecules $[CH_3+H_2+O_2]$, i.e., $([C]-[O])/[CH_3+H_2+O_2]$, is $-0.2\times10^{-2}$ or more and a ratio of the amount (mole) of oxygen atoms [O] to the amount (mole) of carbon atoms [C], i.e., [O]/[C], is 1.2 or less. Specifically, the preferable range of $([C]-[O])/[CH_3+H_2+O_2]$ is from 0 to 0.04, and the preferable range of [O]/[C] is from 0 to 1.00. The substrate temperature is higher than 750° C. and is lower than 1000° C. However, the upper limit of the substrate temperature is 900° C. when a value calculated by dividing a difference between an amount (mole) of carbon atoms [C] and an amount (mole) of oxygen atoms [O] by an amount (mole) of total gas molecules $[CH_3+H_2+O_2]$ is $1.0\times10^{-2}$ or more, or when a ratio ([O]/[C]) of an amount (mole) of oxygen atoms [O] to an amount (mole) of carbon atoms [C] is 0.5 or less.

Figure 4:
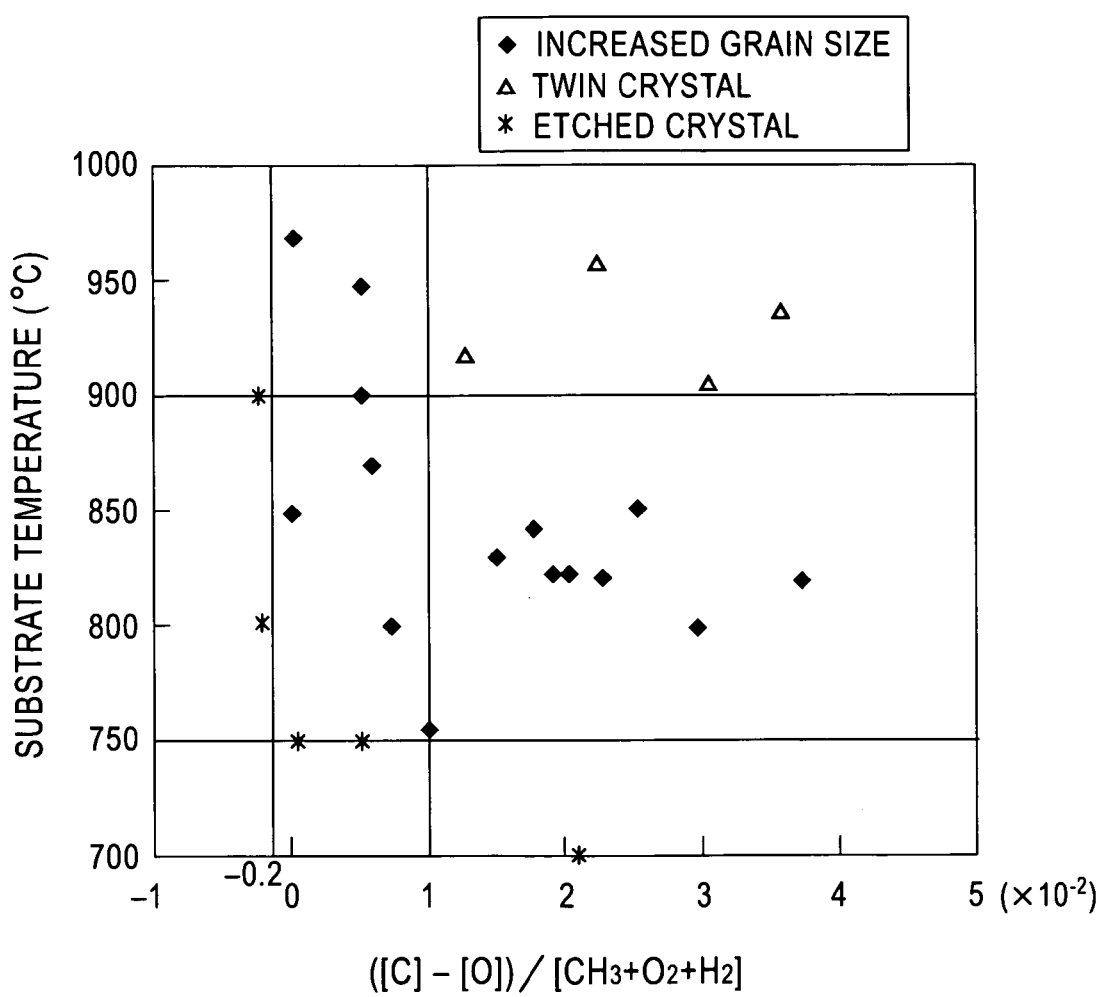
FIG. 4 is a graph showing the relationship among material gas, substrate temperature, and film properties of the diamond layer 2 by plotting $([C]-[O])/[CH_3+H_2+O_2]$ on the horizontal axis and substrate temperature on the vertical axis.
Figure 5:
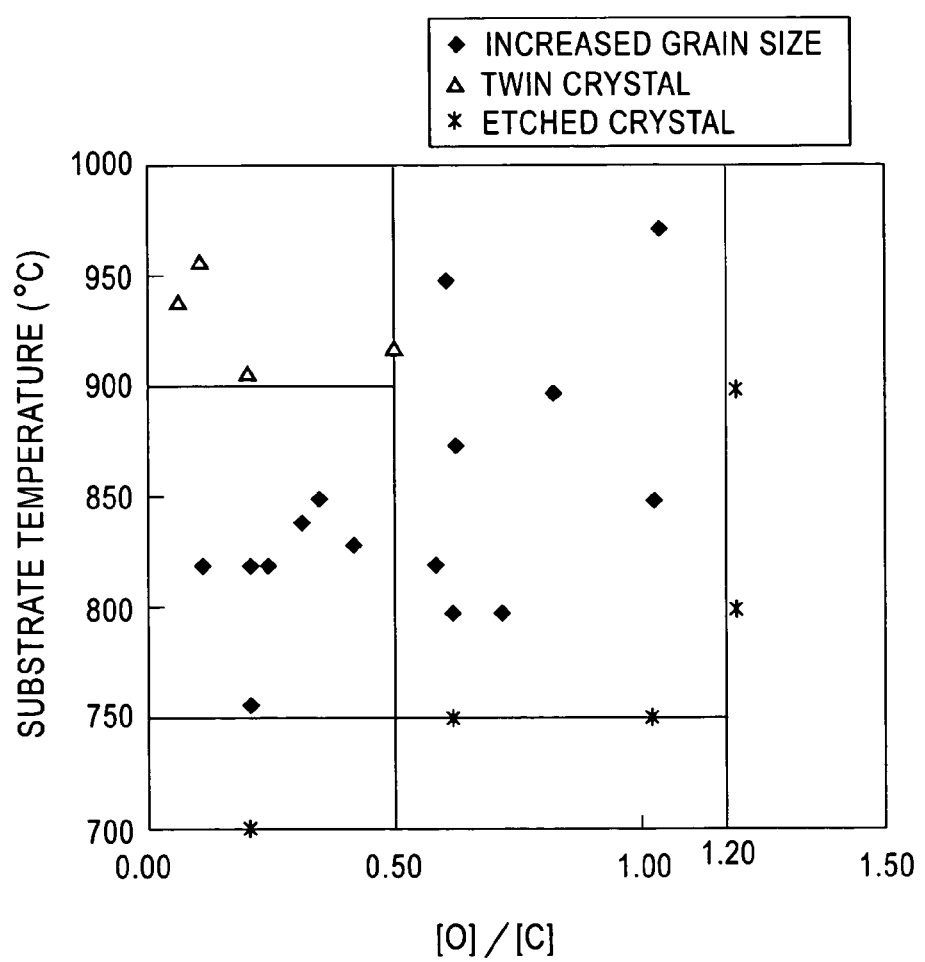
FIG. 5 is a graph showing the relationship among material gas, substrate temperature, and film properties of the diamond layer 2 by plotting [O]/[C] on the horizontal axis and substrate temperature on the vertical axis.

FIG. 4 is a graph showing the relationship among material gas, substrate temperature, and film properties of the diamond layer 2 by plotting $([C]-[O])/[CH_3+H_2+O_2]$ on the horizontal axis and substrate temperature on the vertical axis. FIG. 5 is a graph showing the relationship among material gas, substrate temperature, and film properties of the diamond layer 2 by plotting [O]/[C] on the horizontal axis and substrate temperature on the vertical axis. As shown in FIGS. 4 and 5, when $([C]-[O])/[CH_3+H_2+O_2]$ is lower than $-0.2\times10^{-2}$ or when [O]/[C] is higher than 1.2, diamond is etched during the {100} sector growth and the diamond layer 2 cannot be deposited. When the substrate temperature is 750° C. or less, the film deposition rate becomes lower than 0.4 μm/hr. Therefore, the manufacturing cost increases and, concurrently, diamond is etched during the {100} sector growth and the diamond layer 2 cannot be deposited. Reversely, when substrate temperature is 1000° C. or higher, twin crystals or microcrystals are generated in the diamond layer 2 to increase defects; which is impractical. When $([C]-[O])/[CH_3+H_2+O_2]$ is $1.0\times10^{-2}$ or more or when [O]/[C] is 0.5 or less, twin crystals are generated in the diamond layer 2 to increase defects by raising the substrate temperatures to higher than 900° C.

With reference to FIG. 1, the diamond layer 1 is deposited by {111} sector growth and has substantially constant crystal grain size. The diamond layer 2 is deposited by {100} sector growth on the diamond layer 1 so that the crystal grain size of the diamond layer 2 increases with distance from the diamond layer 1. Thus, a highly-oriented diamond film including the diamond layer 1 and the diamond layer 2 deposited on the diamond layer 1 is yield. The diamond layer 1 and the diamond layer 2 are deposited by {111} sector growth and {100} sector growth, respectively; which can be confirmed by cathodoluminescence spectra. Specifically, in a cathodoluminescence spectrum, a luminescent band referred to as band A, which has a peak at 420 to 440 nm and a half-width of about 70 nm, weakly appears in the {111} sector growth and strongly appears in the {100} sector growth. Therefore, in the cathodoluminescence spectra of the highly-oriented diamond film according to this embodiment, band A is hardly observed and a 575 nm center is predominant in the diamond layer 1. On the other hand, band A appears stronger than the 575 nm center in the diamond layer 2. This proves that the diamond layer 1 has been deposited by the {111} sector growth and the diamond layer 2 has been deposited by the {100} sector growth.

The deposition of the second diamond layer 2 will now be described. In the beginning of the {100} sector growth, oxygen at a low content is better from the viewpoint of the growth rate. When oxygen exists at a high content from the beginning, the growth rate is slow. However, when the growth rate is too high, the grain size cannot be sufficiently increased. Consequently, by controlling the oxygen gas content from the viewpoint of these respects, the second diamond layer can be also deposited by the {100} sector growth of diamond crystals. The second diamond layer can be efficiently deposited with a balance between the growth rate and the increase of grain size by using the oxygen gas at a low content (O/C) in the beginning and then increasing the oxygen gas content gradually or stepwise.

The surface of the highly-oriented diamond film according to this embodiment is flat and hardly contains non-oriented crystals, so a process, such as polishing, for planarizing the surface is unnecessary. Furthermore, the highly-oriented diamond film used in an electronic device does not prevent the conduction of electric charge. Furthermore, even if a diamond film is epitaxially deposited on the surface of the highly-oriented diamond film, variation in the impurity content does not occur and the planarity of the surface after the deposition is not lost. Thus, the highly-oriented diamond film has such advantageous effects. Additionally, the highly-oriented diamond film according to this embodiment has a large average crystal grain size of 50 μm or more and the crystal grain size sharply increases such that the grain-size-increasing rate M is 50% or more, so a highly-oriented diamond film having large grain sizes though the film thickness being smaller than that of conventional films can be yielded. Consequently, the highly-oriented diamond films according to this embodiment are suitable for the use in electronic devices, such as transistors and diodes, in which the grain boundaries and non-oriented crystals may cause a decrease in performance, and are suitable as light-transmission windows. Improvement of performance and a decrease in manufacturing cost can be achieved by the application of the highly-oriented diamond film.

EXAMPLE

The advantageous effects of the present invention will now be described with reference to Examples in comparison with Comparative Examples which are out of the scope of the present invention.

First Test

Firstly, the results of a first test will be described. A silicon substrate having a surface constituted by (100) planes was placed in a microwave CVD system and was irradiated with microwaves at a substrate temperature of 650° C. for 15 mins under a flow of a gaseous mixture of 2% methane by volume and 98% hydrogen by volume under conditions with a pressure of 33 hPa and a flow rate of 300 standard cm³/min (sccm). At this time, the microwave input power was about 1 kW and then was slightly controlled so as to maintain the substrate temperature at 650° C. Simultaneously, a negative bias voltage was applied to the silicon substrate so that a current of 10 mA/cm² flows. Thus, oriented diamond nuclei were formed on the surface of the silicon substrate.

Then, a diamond layer was deposited on the silicon substrate so as to have a thickness of about 2 to 8 μm by {111} sector growth of diamond crystals with the microwave CVD system by using a gaseous mixture of 2% methane by volume and 98% hydrogen by volume as material gas at a substrate temperature of 800 to 850° C. under a flow of the material gas under conditions with a pressure of 160 hPa and a flow rate of 400 standard cm³/min (sccm). The crystal grain sizes of this diamond layer were substantially constant.

Diamond films of Examples 1 to 16 and Comparative Examples 1 to 9 were prepared by depositing diamond crystals by {100} sector growth on the diamond layer deposited by the {111} sector growth using a gaseous mixture of methane, hydrogen, and oxygen as material gas under conditions shown in Table 1. At this time, the pressure of the material gas was 160 hPa and the flow rate of the whole gas was 400 standard cm³/min (sccm). Film deposition rates, grain-size-increasing rates, and surface states of the resulting diamond films were evaluated. The results are shown in Table 1.

TABLE 1

| | Film-forming condition | | | | | Evaluation result | | |
|---|---|---|---|---|---|---|---|---|
| | $CH_3$ flow rate (sccm) | $O_2$ flow rate (sccm) | [O]/[C] | ([C] − [O])/ [$CH_3$ + $O_2$ + $H_2$] | Substrate temperature (° C.) | Film-forming rate (μm/hr) | Increasing rate of grain size (%) | Surface state |
| Example 1 | 5.0 | 0.50 | 0.20 | $1.00 \times 10^{-2}$ | 754 | 0.4 | 72 | Increased grain size |
| Example 2 | 5.0 | 1.50 | 0.60 | $0.50 \times 10^{-2}$ | 950 | 1.7 | 112 | Increased grain size |
| Example 3 | 5.0 | 2.50 | 1.00 | 0.00 | 969 | 0.6 | 93 | Increased grain size |
| Example 4 | 10.0 | 1.50 | 0.30 | $1.74 \times 10^{-2}$ | 840 | 0.7 | 65 | Increased grain size |
| Example 5 | 15.0 | 2.50 | 0.33 | $2.48 \times 10^{-2}$ | 851 | 1.0 | 76 | Increased grain size |
| Example 6 | 10.0 | 0.50 | 0.10 | $2.25 \times 10^{-2}$ | 821 | 15.0 | 59 | Increased grain size |
| Example 7 | 10.0 | 1.00 | 0.20 | $2.00 \times 10^{-2}$ | 821 | 12.3 | 72 | Increased grain size |
| Example 8 | 10.0 | 1.20 | 0.24 | $1.89 \times 10^{-2}$ | 821 | 9.1 | 79 | Increased grain size |
| Example 9 | 10.0 | 2.00 | 0.40 | $1.49 \times 10^{-2}$ | 830 | 7.8 | 86 | Increased grain size |
| Example 10 | 10.0 | 4.00 | 0.80 | $0.50 \times 10^{-2}$ | 900 | 1.0 | 98 | Increased grain size |
| Example 11 | 35.0 | 10.00 | 0.57 | $3.66 \times 10^{-2}$ | 820 | 17.3 | 74 | Increased grain size |
| Example 12 | 6.0 | 1.80 | 0.60 | $0.60 \times 10^{-2}$ | 870 | 1.1 | 59 | Increased grain size |
| Example 13 | 15.0 | 7.50 | 1.00 | 0.00 | 850 | 0.7 | 68 | Increased grain size |
| Example 14 | 7.5 | 2.25 | 0.60 | $0.75 \times 10^{-2}$ | 800 | 2.1 | 65 | Increased grain size |
| Example 15 | 40.0 | 14.00 | 0.70 | $2.90 \times 10^{-2}$ | 800 | 6.5 | 70 | Increased grain size |
| Comparative Example 1 | 10.0 | 0.50 | 0.10 | $2.25 \times 10^{-2}$ | 958 | 5.6 | 43 | Having twin-crystal |
| Comparative Example 2 | 10.0 | 2.50 | 0.50 | $1.24 \times 10^{-2}$ | 920 | 5.1 | 22 | Having twin-crystal |
| Comparative Example 3 | 15.0 | 0.50 | 0.07 | $3.50 \times 10^{-2}$ | 940 | 11.1 | 19 | Having twin-crystal |
| Comparative | 15.0 | 1.50 | 0.20 | $2.99 \times 10^{-2}$ | 906 | 6.8 | 22 | Having twin-crystal |

TABLE 1-continued

| | Film-forming condition | | | | | Evaluation result | | |
|---|---|---|---|---|---|---|---|---|
| | $CH_3$ flow rate (sccm) | $O_2$ flow rate (sccm) | [O]/[C] | ([C] − [O])/ [$CH_3$ + $O_2$ + $H_2$] | Substrate temperature (° C.) | Film-forming rate (μm/hr) | Increasing rate of grain size (%) | Surface state |
| Example 4 Comparative Example 5 | 5.0 | 1.50 | 0.60 | $0.50 \times 10^{-2}$ | 750 | — | — | Etched crystal |
| Comparative Example 6 | 5.0 | 2.50 | 1.00 | 0.00 | 750 | — | — | Etched crystal |
| Comparative Example 7 | 5.0 | 3.00 | 1.20 | $-0.25 \times 10^{-2}$ | 800 | — | — | Etched crystal |
| Comparative Example 8 | 5.0 | 3.00 | 1.20 | $-0.25 \times 10^{-2}$ | 900 | — | — | Etched crystal |
| Comparative Example 9 | 10.0 | 1.00 | 0.20 | $2.00 \times 10^{-2}$ | 700 | — | — | Etched crystal |

As shown in Table 1, diamond films of Comparative Examples 1 to 4 in which the substrate temperature was higher than 900° C. had surfaces containing twin crystals, although [O]/[C] was 0.5 or less. In the diamond films of Comparative Examples 5, 6, and 9 in which the substrate temperature was 750° C. or less, diamond was etched during the {100} sector growth, so diamond layers were not deposited on the diamond layers prepared by the {111} sector growth. Additionally, in the diamond films of Comparative Examples 7 and 8 in which ([C]−[O])/[$CH_3$+$H_2$+$O_2$] was lower than $0.2 \times 10^{-2}$, diamond was similarly etched during the {100} sector growth, so diamond layers were not deposited on the diamond layers prepared by the {111} sector growth. On the other hand, all diamond films of Examples 1 to 15 exhibited a grain-size-increasing rate of higher than 50%, and the average rate was 70% and the highest rate was 112% (Example 2). Non-orientation was not observed in the surfaces of these diamond films, and the surfaces were flat. Furthermore, even the lowest film deposition rate was 0.4 μm/hr (Example 1) and the highest film deposition rate was 17.3 μm/hr (Example 11).

As Comparative Example 10, diamond layers were deposited by {100} sector growth of diamond crystals on each of the diamond layers deposited by the {111} sector growth of diamond crystals under the same conditions as in Examples 6, 7, and 8 except that the material gas pressure was 67 hPa. The surfaces of all diamond films were flat, but the crystal grain sizes were not substantially increased and some non-oriented crystals were observed in the surfaces. Furthermore, the film deposition rate was 0.3 μm/hr or less.

Second Test

Figure 6:
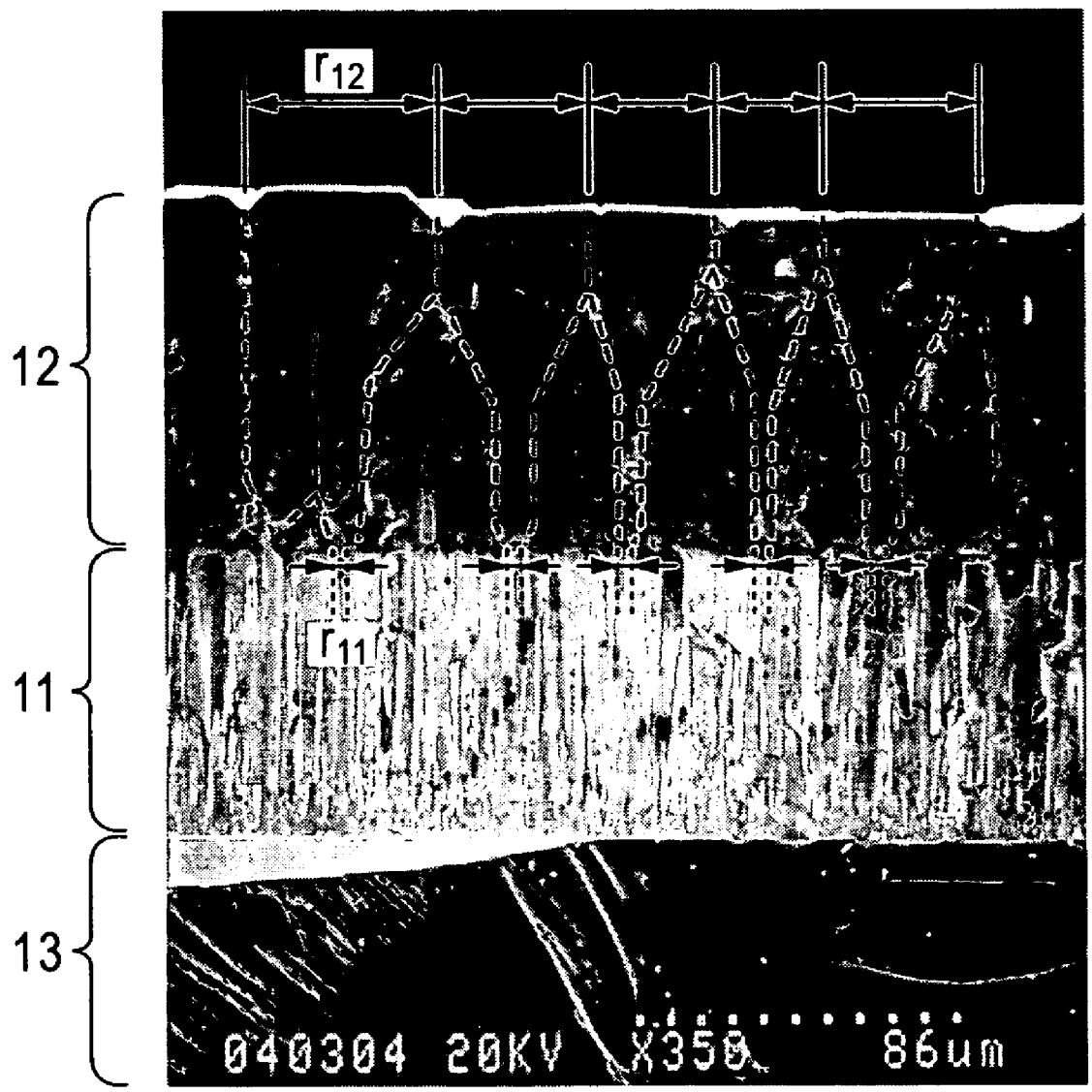
FIG. 6 is a photograph (SEM photograph: ×350) of a highly-oriented diamond film of a second test according to the present invention.

Next, the results of a second test will be described. With the same method and conditions as in the first test, diamond crystals were deposited on a silicon substrate by {111} sector growth, and then diamond crystals were deposited by {100} sector growth on the resulting diamond layer under the same conditions as in Example 6 shown in Table 1. Then, diamond crystals were further deposited by {100} sector growth under the same conditions as in Example 7 shown in Table 1. Changes in the grain sizes were observed. FIG. 6 is a scanning electron microscope (SEM) photograph (×350) of the highly-oriented diamond film according to this test. As shown in FIG. 6, the grain size $r_{11}$ of the first diamond layer 11 deposited on the silicon substrate 13 was about 3 μm on an average. When the film thickness of the second diamond layer 12 was 8 μm, the grain size $r_{12}$ was increased to 8 μm (grain-size-increasing rate: about 60%) and the surface became flat. Furthermore, the film was deposited until the film thickness became 25 μm under the same conditions, but the grain-size-increasing rate was decreased. Additionally, the grain size started to increase again by depositing a third diamond layer on the diamond layer 12 under modified conditions, and the average crystal grain size increased to 35 μm (grain-size-increasing rate: 68%) till the film thickness became about 40 μm. Then, the grain-size-increasing rate was decreased. Finally, the highly-oriented diamond film having an average crystal grain size of 35 μm and the surface being flat and hardly containing non-oriented crystals was yielded.

Third Test

Figure 7A:
FIG. 7A is a photograph (SEM photograph: ×250) of a cross-section of a diamond film of Example 8 according to the present invention.
Figure 7B:
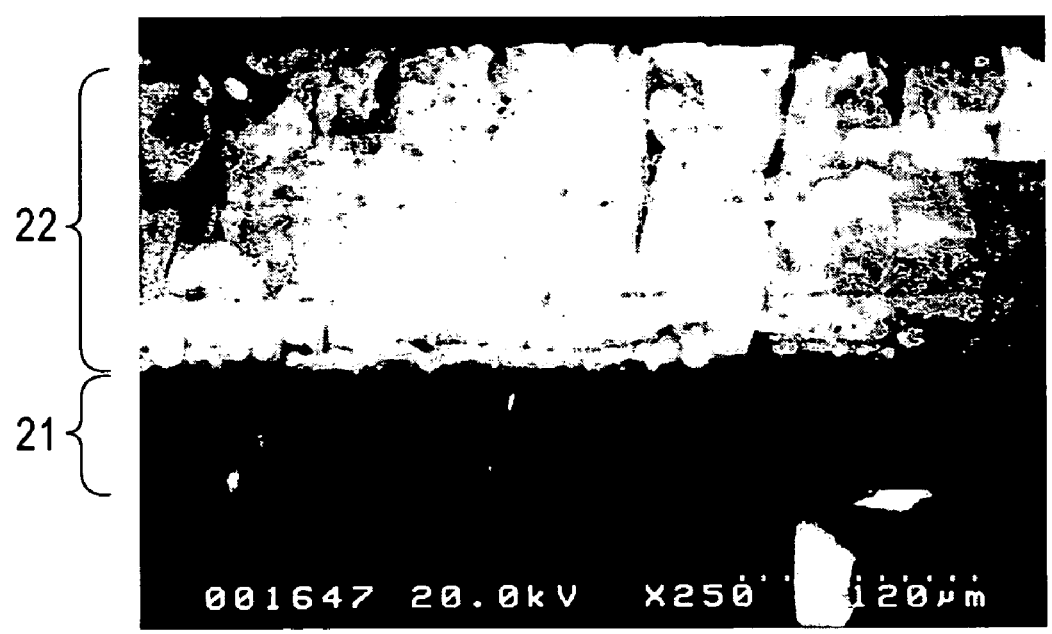
FIG. 7B is a photograph (×250) of cathodoluminescence image of the diamond film.
Figure 8:
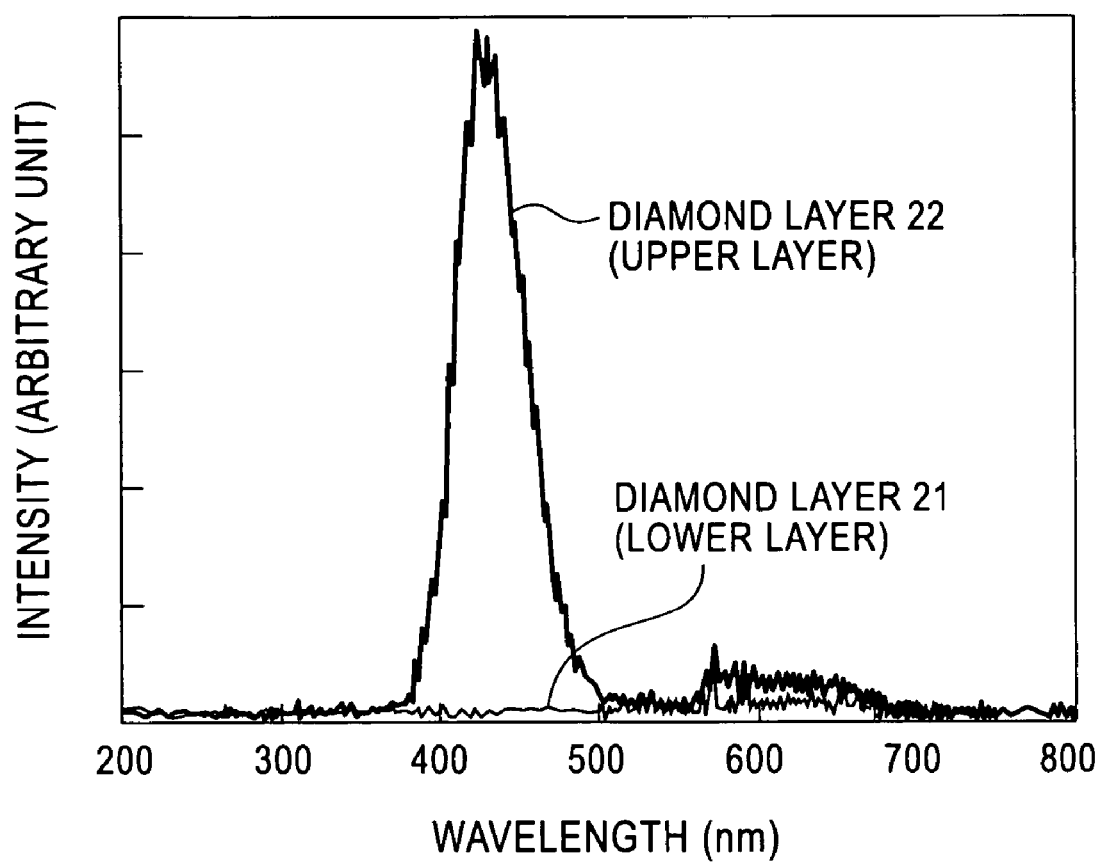
FIG. 8 is a graph showing cathodoluminescence spectra of the diamond film of Example 8 by plotting wavelength on the horizontal axis and intensity on the vertical axis.

Next, the results of a third test will be described. The cross-section observation and cathodoluminescence measurement of the diamond film of Example 8 shown in Table 1 were performed. FIG. 7A is a SEM photograph (×250) of a cross-section of the diamond film of Example 8, and FIG. 7B is the cathodoluminescence image (×250). FIG. 8 is a graph showing cathodoluminescence spectra of the diamond film of Example 8 by plotting wavelength on the horizontal axis and intensity on the vertical axis. As shown in FIG. 7A, the diamond film of Example 8 had a diamond layer 22 on a diamond layer 21. The grain sizes of the diamond layer 22 increased with growth and the grain sizes of the diamond layer 21 were substantially constant. In addition, in FIG. 7A, the diamond layer 22 of the upper layer is seen to have two layers, but this is not changes in the properties of the film. This is caused by charge-up at observation time.

In the cathodoluminescence image shown in FIG. 7B, the white portion was emitting light having a wavelength of 431 nm. As shown in FIG. 7B, the diamond layer 22 of the upper layer was evidently emitting light, but the diamond layer 21 of the lower layer was barely emitting light. Furthermore, as shown in FIG. 8, the diamond layer 22 of the upper layer predominantly emitted a light having a wavelength of 431 nm and slightly emitted a light having a wavelength of 575 nm center. On the other hand, the diamond layer 21 of the lower layer barely emitted a light having a wavelength of 431 nm and emitted a light having a wavelength of 575 nm center alone. This also proves that the diamond layer 21 of the lower layer was mainly deposited by {111} sector growth and the diamond layer 22 of the upper layer was mainly deposited by {100} sector growth.

Thus, the highly-oriented diamond films according to the present invention are suitable for the use in electronic devices such as transistors and diodes and are suitable as light-transmission windows.

What is claimed is:

1. A highly-oriented diamond film comprising a first diamond layer deposited by {111} sector growth and a second diamond layer deposited on the first diamond layer by {100} sector growth so that the crystal grain sizes increase with distance from the first diamond layer, wherein an average crystal grain size of the second diamond layer at the surface is represented by Da (μm); an average crystal grain size of the first diamond layer at the boundary of the first diamond layer and the second diamond layer or an average crystal grain size of the first diamond layer at a cross-section being the closest to the boundary and parallel to the surface of the second diamond layer when the boundary is not parallel to the surface of the second diamond layer is represented by Db (μm); and a distance from the surface of the second diamond layer to the boundary or the cross-section is represented by L (μm), wherein a grain-size-increasing rate M (%) that is calculated by the following mathematical formula:

$$M=\{(Da-Db)/L\}\times 100$$

is 50% or higher.

2. The highly-oriented diamond film according to claim 1, wherein the average crystal grain size at the surface of the second diamond layer is 30 μm or more.

3. The highly-oriented diamond film according to claim 2, wherein the average crystal grain size at the surface of the second diamond layer is 100 μm or more.

* * * * *